United States Patent
King et al.

(10) Patent No.: US 11,909,317 B2
(45) Date of Patent: Feb. 20, 2024

(54) EFFICIENT USE OF ENERGY IN A SWITCHING POWER CONVERTER

(71) Applicant: Cirrus Logic International Semiconductor Ltd., Edinburgh (GB)

(72) Inventors: Eric J. King, Austin, TX (US); Ajit Sharma, Austin, TX (US); Lingli Zhang, Austin, TX (US); Christian Larsen, Austin, TX (US); Graeme G. Mackay, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 0 days.

(21) Appl. No.: 18/174,106

(22) Filed: Feb. 24, 2023

(65) Prior Publication Data

US 2023/0208303 A1    Jun. 29, 2023

Related U.S. Application Data

(62) Division of application No. 17/825,775, filed on May 26, 2022, now abandoned, which is a division of
(Continued)

(51) Int. Cl.
*H02M 3/158* (2006.01)
*H02M 1/08* (2006.01)
(Continued)

(52) U.S. Cl.
CPC ........... *H02M 3/158* (2013.01); *H02M 1/008* (2021.05); *H02M 1/08* (2013.01); *H02M 3/1584* (2013.01); *H03F 3/19* (2013.01); *H03G 3/004* (2013.01)

(58) Field of Classification Search
CPC ....... H02M 3/158; H03G 3/004; H03G 3/007; H03F 3/19
See application file for complete search history.

(56) References Cited

U.S. PATENT DOCUMENTS 5,248,524 A    9/1993    Soderlund
5,617,016 A    4/1997    Borghi et al.
(Continued)

FOREIGN PATENT DOCUMENTS

CN    110784140 A    2/2020
EP    1919058 A2    5/2008
(Continued)

OTHER PUBLICATIONS

First Office Action, China National Intellectual Property Administration, CN Application No. 202080064415.9, dated Feb. 5, 2023.
(Continued)

*Primary Examiner* — Alex Torres-Rivera
(74) *Attorney, Agent, or Firm* — Jackson Walker L.L.P.

(57) ABSTRACT

A system may include a power converter having a maximum allowable input power drawn from a power source, an energy storage element coupled to an output of the power converter at a top plate of the energy storage element, wherein the energy storage element is configured to store excess energy, and control circuitry configured to, when an input power of the power converter exceeds the maximum allowable input power, cause excess energy stored in the energy storage element to be consumed by circuitry coupled to the output of the power converter, and in order to maintain positive voltage headroom for the circuitry coupled to the output of the power converter, selectively couple a bottom plate of the energy storage element to the power source such that excess energy stored by the circuitry coupled to the output of the power converter is consumed from the energy storage device when the input power of the power converter exceeds the maximum allowable input power.

2 Claims, 8 Drawing Sheets

Related U.S. Application Data application No. 16/916,395, filed on Jun. 30, 2020, now Pat. No. 11,387,732.

(60) Provisional application No. 62/899,415, filed on Sep. 12, 2019.

(51) Int. Cl.
*H02M 1/00* (2006.01)
*H03G 3/00* (2006.01)
*H03F 3/19* (2006.01)

(56) References Cited

U.S. PATENT DOCUMENTS

| | | |
|---|---|---|
| 5,757,167 A | 5/1998 | Arora et al. |
| 6,177,783 B1 | 6/2001 | Donohue |
| 6,597,158 B2 | 7/2003 | Umeda |
| 7,102,340 B1 | 9/2006 | Ferguson |
| 7,190,150 B2 | 3/2007 | Chen et al. |
| 7,906,939 B2 | 3/2011 | Kung et al. |
| 9,088,247 B2 | 7/2015 | Arno et al. |
| 9,577,587 B2 | 2/2017 | Maru et al. |
| 9,639,102 B2 | 5/2017 | Dally |
| 9,742,393 B2 | 8/2017 | Pavao-Moreira et al. |
| 10,263,523 B1 | 4/2019 | Sonntag et al. |
| 10,283,989 B1 | 5/2019 | Hogan et al. |
| 10,476,392 B1 | 11/2019 | Matsuura et al. |
| 10,673,423 B2 | 6/2020 | Forghani-Zadeh et al. |
| 10,720,835 B2 | 7/2020 | King et al. |
| 10,734,885 B2 | 8/2020 | King et al. |
| 2001/0020802 A1 | 9/2001 | Kitagawa et al. |
| 2005/0264268 A1 | 12/2005 | Jeno |
| 2006/0139819 A1 | 6/2006 | May |
| 2008/0129219 A1 | 6/2008 | Smith et al. |
| 2008/0259647 A1 | 10/2008 | Risseeuw |
| 2008/0278136 A1 | 11/2008 | Murtojarvi |
| 2009/0016549 A1 | 1/2009 | French et al. |
| 2009/0266397 A1 | 10/2009 | Gibson et al. |
| 2010/0019702 A1 | 1/2010 | Jang et al. |
| 2010/0156175 A1 | 6/2010 | Wei |
| 2011/0075446 A1 | 3/2011 | Doutreloigne et al. |
| 2011/0121653 A1 | 5/2011 | Hartular et al. |
| 2011/0309679 A1 | 12/2011 | Fisher et al. |
| 2012/0205974 A1 | 8/2012 | McCaslin et al. |
| 2012/0268094 A1 | 10/2012 | Scaldaferri et al. |
| 2013/0106188 A1 | 5/2013 | Ishibashi et al. |
| 2013/0249505 A1 | 9/2013 | Brown et al. |
| 2014/0197814 A1 | 7/2014 | Shi et al. |
| 2015/0222235 A1 | 8/2015 | Swanson et al. |
| 2016/0064986 A1 | 3/2016 | Langlinais et al. |
| 2016/0094186 A1 | 3/2016 | Cohen |
| 2017/0005647 A1 | 1/2017 | Pan et al. |
| 2017/0072812 A1 | 3/2017 | Von Novak et al. |
| 2018/0123516 A1* | 5/2018 | Kim ................. H03F 3/189 |
| 2019/0181754 A1 | 6/2019 | Ash et al. |
| 2019/0245444 A1 | 8/2019 | Kimrua |
| 2020/0235712 A1 | 7/2020 | May et al. |
| 2020/0336122 A1* | 10/2020 | Lin ................. H03G 3/3042 |
| 2021/0159798 A1 | 5/2021 | Mackay et al. |
| 2021/0364560 A1 | 11/2021 | Holland et al. |
| 2021/0367510 A1 | 11/2021 | Lawrence et al. |
| 2021/0367513 A1 | 11/2021 | Mackay et al. |
| 2021/0367514 A1 | 11/2021 | Lawrence et al. |
| 2021/0367515 A1 | 11/2021 | Mackay et al. |
| 2021/0367517 A1 | 11/2021 | Lawrence et al. |

FOREIGN PATENT DOCUMENTS

| | | |
|---|---|---|
| EP | 2775599 A1 | 9/2014 |
| EP | 3214746 A1 | 9/2017 |
| EP | 3240171 A1 | 11/2017 |
| FR | 2851091 A1 | 8/2004 |
| GB | 2555902 A | 5/2018 |
| TW | 201228201 A | 7/2012 |
| WO | 2012135778 A1 | 10/2012 |
| WO | 2017027393 A1 | 2/2017 |
| WO | 2019135820 A1 | 7/2019 |

OTHER PUBLICATIONS

International Search Report and Written Opinion of the International Searching Authority, International Application No. PCT/US2021/039373, dated Sep. 22, 2021.
Yu, Yangwei: "Choosing the Boost with Bypass or Pass Through", Jun. 30, 2017, Retrieved from the Internet Sep. 10, 2021.
Texas Instruments: TPS61291 Loe IQ Boost Converter with Bypass Operation, Sep. 30, 2014, Retrieved from the Internet Sep. 10, 2021.
International Search Report and Written Opinion of the International Searching Authority, International Application No. PCT/US2020/039509, dated Oct. 8, 2021.
International Search Report and Written Opinion of the International Searching Authority, International Application No. PCT/US2020/041535, dated Oct. 14, 2021.
Search Report under Section 17, UKIPO, Application No. GB2106142.9, dated Oct. 20, 2021.
Combined Search and Examination Report under Sections 17 and 18(3), UKIPO, Application No. GB2106144.5, dated Oct. 25, 2021.
International Search Report and Written Opinion of the International Searching Authority, International Application No. PCT/US2021/041547, dated Nov. 2, 2021.
International Search Report and Written Opinion of the International Searching Authority, International Application No. PCT/US2021/041918, dated Nov. 10, 2021.
International Search Report and Written Opinion of the International Searching Authority, International Application No. PCT/US2021/041544, dated Nov. 10, 2021.
Stmicroelectronics NV, AN4218—Hardware design guideline power supply and voltage measurement—Application Note, Doc ID 024014 Rev 3, 26 pages, Oct. 2015.
Freescale Semiconductor, Inc., Multimedia Applications Division, i.MX233 Power Management Unit and Battery Charger—Application Note, Document No. AN3883, Rev. 0, 36 pages, Jul. 2009.
Texas Instruments, TPS6128x Low-, Wide-Voltage Battery Front-End DC/DC Converter Single-Cell Li-Ion, Ni-Rich, Si-Anode Applications—Data sheet, SLVSBI1A, 57 pages, Oct. 2013, Revised Sep. 2014.
Texas Instruments, Designing Robust TPS65217 Systems for VIN Brownout—Application Report, 13 pages, Oct. 2017.
Renesas Electronics Corporation, Preventing Subsystem Brownouts in Mobile Devices—White Paper, 6 pages.
MFJ Enterprises, Inc., MFJ—Super Battery Booster—Model MFJ-4416C—Instruction Manual, Version 0A, 16 pages, 2017.
International Search Report and Written Opinion of the International Searching Authority, International Application No. PCT/US2020/056782, dated Mar. 4, 2021.
Van Vroonhoven, Caspar, A 0-to-60V-Input Vcm Coulomb Counter with Signal-Dependent Supply Current and ±0.5% Gain Inaccuracy from −50° C. to 125° C., 2020 IEEE International Solid-State Circuits Conference, Feb. 19, 2020.
International Search Report and Written Opinion of the International Searching Authority, International Application No. PCT/US2021/029631, dated Jul. 23, 2021.
Qiu et al., "Digital Average Current-Mode Control of PWM DC-DC Converts without Current Sensors", IEEE Transactions on Industrial Electronics, IEEE Service Center, vol. 57, No. 5, May 10, 2010, Piscataway, NJ, USA.
International Search Report and Written Opinion of the International Searching Authority, International Application No. PCT/US2021/029584, dated Jul. 30, 2021.
International Search Report and Written Opinion of the International Searching Authority, International Application No. PCT/US2021/032474, dated Aug. 3, 2021.
Vinnikov et al., "Solar Optiverter—A Novel Hybrid Approach to the PHotovoltaic Module Level Power Electronics", IEEE Transactions

(56) References Cited

OTHER PUBLICATIONS on Industrial Electronics, IEEE Service Center, vol. 66, No. 5, May 1, 2019, pp. 3869-3880, Piscataway, NJ, USA.
International Search Report and Written Opinion of the International Searching Authority, International Application No. PCT/US2021/032496, dated Aug. 4, 2021.
International Search Report and Written Opinion of the International Searching Authority, International Application No. PCT/US2021/030932, dated Aug. 20, 2021.
International Search Report and Written Opinion of the International Searching Authority, International Application No. PCT/US2021/039356, dated Oct. 1, 2021.
International Search Report and Written Opinion of the International Searching Authority, International Application No. PCT/US2020/047237, dated Oct. 30, 2020.
Stala, Robert et al., "A Switched-Capacitor DC-DC Converter with Variable No. of Voltage Gains and Fault-Tolerant Operation", IEEE Transactions on Industrial Electronics, IEEE Service Center, Piscataway, NJ, US, vol. 66, No. 5, May 1, 2019.

* cited by examiner

EFFICIENT USE OF ENERGY IN A SWITCHING POWER CONVERTER

RELATED APPLICATIONS

The present disclosure is a divisional of U.S. Non-provisional patent application Ser. No. 17/825,775, filed May 26, 2022, which is a divisional of U.S. Non-provisional patent application Ser. No. 16/916,395, filed Jun. 30, 2020, issued as U.S. Pat. No. 11,387,732 on Jul. 12, 2022, which claims priority to U.S. Provisional Patent Application Ser. No. 62/899,415, filed Sep. 12, 2019, each of which is incorporated by reference herein in its entirety.

FIELD OF DISCLOSURE

The present disclosure relates in general to circuits for electronic devices, including without limitation personal audio devices such as wireless telephones and media players, and more specifically, to limited average current in a peak-controlled boost converter.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a speaker driver including a power amplifier for driving an audio output signal to headphones or speakers. Oftentimes, a power converter may be used to provide a supply voltage to a power amplifier in order to amplify a signal driven to speakers, headphones, or other transducers. A switching power converter is a type of electronic circuit that converts a source of power from one direct current (DC) voltage level to another DC voltage level. Examples of such switching DC-DC converters include but are not limited to a boost converter, a buck converter, a buck-boost converter, an inverting buck-boost converter, and other types of switching DC-DC converters. Thus, using a power converter, a DC voltage such as that provided by a battery may be converted to another DC voltage used to power the power amplifier.

Often, boost converters operate as peak current-controlled boost converters, wherein a main control loop of a control system is used to determine a peak current requirement on each switching phase of the boost converter in order to generate a desired boosted output voltage of the boost converter. For boost duty cycles where a duty cycle (e.g., which may be determined by subtracting an arithmetic ratio from the number one, wherein the arithmetic ratio equals the input voltage supplied to the boost converter divided by the boost output voltage of the boost converter), slope compensation circuitry may be required to avoid sub-harmonic behavior of the boost converter. Also present in many boost converter control systems is protection circuitry to ensure that the current of a boost converter is maintained below a maximum value. The detection of the peak current in accordance with the main control loop and detection of the maximum allowable current is often performed by two separate circuits: a first comparator comparing a measured current (e.g., measured current of a power inductor of the boost converter) with a slope-compensated target peak current signal and a second comparator comparing the measured current to the maximum current limit. The main control loop, which may also be known as a compensator, may generate a target peak current signal which may be modified by slope compensation circuitry, and such slope-compensated target peak current signal may be compared by the first comparator to the measured current in order to perform peak-current control of a boost converter. However, because slope compensation may occur in analog circuitry, an unknown amount of correction may exist at the point the first comparator toggles. Such error may be removed by the main control loop in regulating the boosted voltage output by the power converter.

However, the presence of this unknown error may result in the inability to directly control the maximum current during any specific switching cycle of the boost converter. This lack of control occurs because the second comparator allows for a measurement without slope compensation of the inductor current above a threshold. If the second comparator is used to control the current in the inductor directly, the lack of slope compensation on this measurement may result in sub-harmonic behavior. To avoid such sub-harmonic behavior while limiting the current as detected by the second comparator, the output of the second comparator may be fed back to allow control circuitry to apply desired limit behavior to the slope-compensated target peak current signal. For example, an additional control loop may be present such that when operating under the current-limited condition, the slope-compensated target peak current signal is modified to obtain the desired limited current behavior.

As a result, a control system may be created that results in limiting and controlling the peak current of a power inductor of a boost converter below a maximum threshold. However, in many systems, an error between the peak inductor current and the average inductor current can be quite large and inductor variation can lead to significant challenges in determining a proper peak current limitation.

SUMMARY

In accordance with the teachings of the present disclosure, one or more disadvantages and problems associated with existing approaches to operating a power converter may be reduced or eliminated.

In accordance with embodiments of the present disclosure, a system may include a power converter having a maximum allowable input power drawn from a power source, an energy storage element coupled to an output of the power converter at a top plate of the energy storage element, wherein the energy storage element is configured to store excess energy, and control circuitry configured to, when an input power of the power converter exceeds the maximum allowable input power, cause excess energy stored in the energy storage element to be consumed by circuitry coupled to the output of the power converter, and in order to maintain positive voltage headroom for the circuitry coupled to the output of the power converter, selectively couple a bottom plate of the energy storage element to the power source such that excess energy stored by the circuitry coupled to the output of the power converter is consumed from the energy storage device when the input power of the power converter exceeds the maximum allowable input power.

In accordance with these and other embodiments of the present disclosure, a system may include a power converter configured to generate a first supply voltage at a first supply output and a second supply output configured to generate a second supply voltage lower than the first supply voltage, wherein the second supply voltage tracks an envelope of an output signal generated by an amplifier coupled to the power supply.

In accordance with these and other embodiments of the present disclosure, a system may include a power supply comprising a power converter configured to generate a first supply voltage at a first supply output of the power supply and a second supply output configured to generate a second supply voltage lower than the first supply voltage. The system may also include an amplifier coupled to the power supply and configured to select between the first supply voltage and the second supply voltage as a supply voltage to the amplifier.

In accordance with these and other embodiments of the present disclosure, a system may include a power converter configured to generate a first supply voltage at a first supply output of the power supply, the power converter having a maximum allowable input power drawn from a power source, an energy storage element coupled to an output of the power converter at a top plate of the energy storage element, wherein the energy storage element is configured to store excess energy, and a second supply output configured to generate a second supply voltage lower than the first supply voltage. The second supply voltage may track an envelope of an output signal generated by an amplifier coupled to the power supply when the amplifier consumes power from the second supply output and the second supply voltage may regulate a voltage at a bottom plate of the energy storage element when the amplifier consumes power from the first supply output.

In accordance with these and other embodiments of the present disclosure, a method may include, in a system having a power converter having a maximum allowable input power drawn from a power source and an energy storage element coupled to an output of the power converter at a top plate of the energy storage element, wherein the energy storage element is configured to store excess energy: when an input power of the power converter exceeds the maximum allowable input power, causing excess energy stored in the energy storage element to be consumed by circuitry coupled to the output of the power converter, and in order to maintain positive voltage headroom for the circuitry coupled to the output of the power converter, selectively coupling a bottom plate of the energy storage element to the power source such that excess energy stored by the circuitry coupled to the output of the power converter is consumed from the energy storage device when the input power of the power converter exceeds the maximum allowable input power.

In accordance with these and other embodiments of the present disclosure, a method may include generating a first supply voltage at a first supply output with a power converter and generating a second supply voltage lower than the first supply voltage with a second supply output, wherein the second supply voltage tracks an envelope of an output signal generated by an amplifier coupled to the power supply.

In accordance with these and other embodiments of the present disclosure, a method may include generating a first supply voltage of a power supply at a first supply output with a power converter, generating a second supply voltage of the power supply lower than the first supply voltage with a second supply output, and selecting, by an amplifier coupled to the power supply, between the first supply voltage and the second supply voltage as a supply voltage to the amplifier.

In accordance with these and other embodiments of the present disclosure, a method may be provided for use in a system having a power converter configured to generate a first supply voltage at a first supply output of the power supply, the power converter having a maximum allowable input power drawn from a power source, an energy storage element coupled to an output of the power converter at a top plate of the energy storage element, wherein the energy storage element is configured to store excess energy, and a second supply output configured to generate a second supply voltage lower than the first supply voltage. The method may include tracking, with the second supply voltage, an envelope of an output signal generated by an amplifier coupled to the power supply when the amplifier consumes power from the second supply output and regulating, with the second supply voltage, a voltage at a bottom plate of the energy storage element when the amplifier consumes power from the first supply output.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
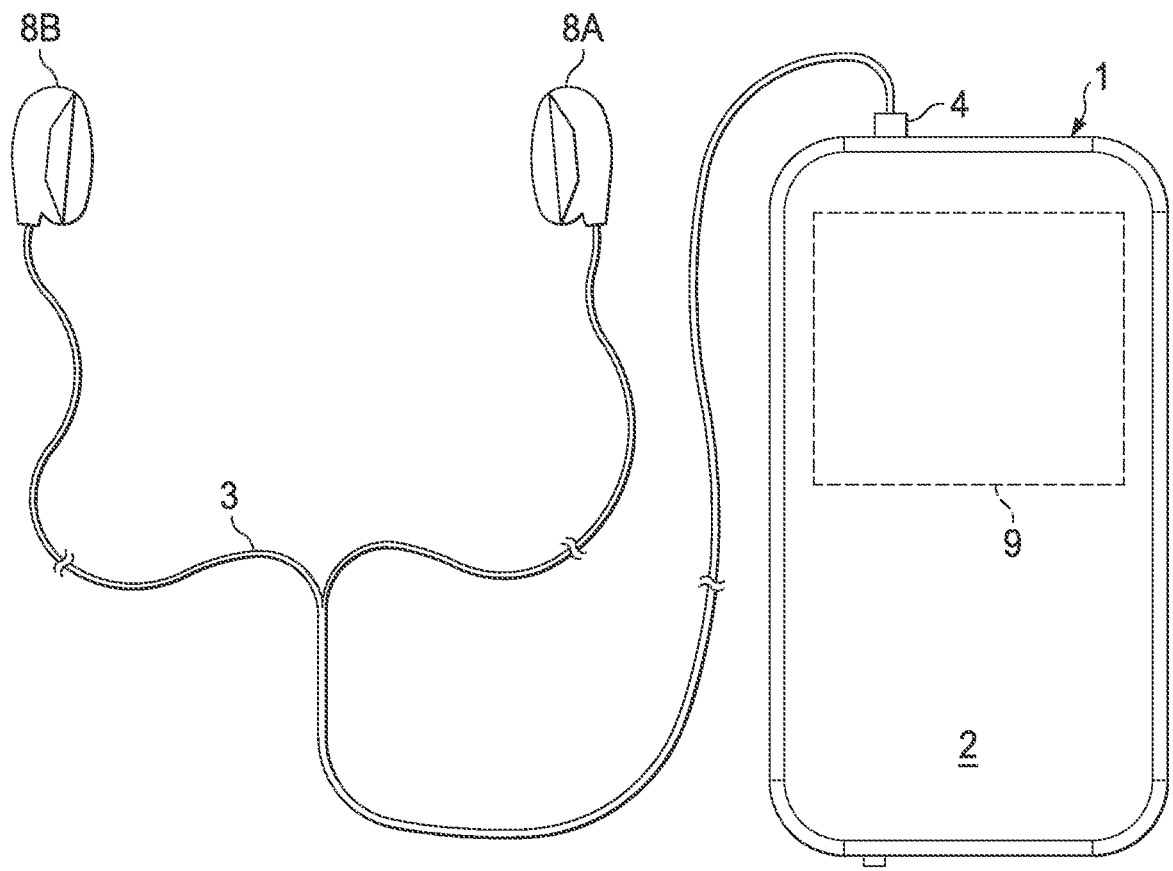
FIG. 1 illustrates an example personal audio device, in accordance with embodiments of the present disclosure.

FIG. 1 illustrates an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
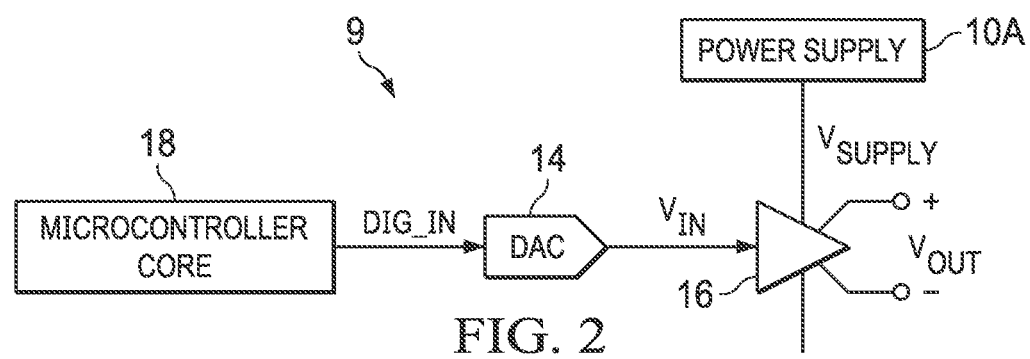
FIG. 2 illustrates a block diagram of selected components of an example integrated circuit of a personal audio device, in accordance with embodiments of the present disclosure.

FIG. 2 illustrates a block diagram of selected components of an example IC 9A of a personal audio device, in accordance with embodiments of the present disclosure. In some embodiments, example IC 9A shown in FIG. 2 may be used to implement IC 9 of FIG. 1. As shown in FIG. 2, a microcontroller core 18 may supply a digital input signal DIG_IN to a digital-to-analog converter (DAC) 14, which may convert the digital input signal to an analog signal $V_{IN}$. DAC 14 may supply analog signal $V_{IN}$ to an amplifier 16 which may amplify or attenuate input signal $V_{IN}$ to provide a differential output signal $V_{OUT}$, which may operate a speaker, a headphone transducer, a line level signal output, and/or other suitable output. In some embodiments, DAC 14 may be an integral component of amplifier 16. A power supply 10A may provide the power supply rail inputs of amplifier 16. In some embodiments, power supply 10A may comprise a switched-mode power converter, as described in greater detail below. Although FIGS. 1 and 2 contemplate that IC 9A resides in a personal audio device, systems and methods described herein may also be applied to electrical and electronic systems and devices other than a personal audio device, including systems for use in a computing device larger than a personal audio device, such as an automobile, a building, or other structure. Further, systems and methods described herein may also be applied to electrical and electronic systems and devices other than audio devices and audio transducers, such as vibro-haptic transducers, piezoelectric transducers, or other transducers.

Figure 3:
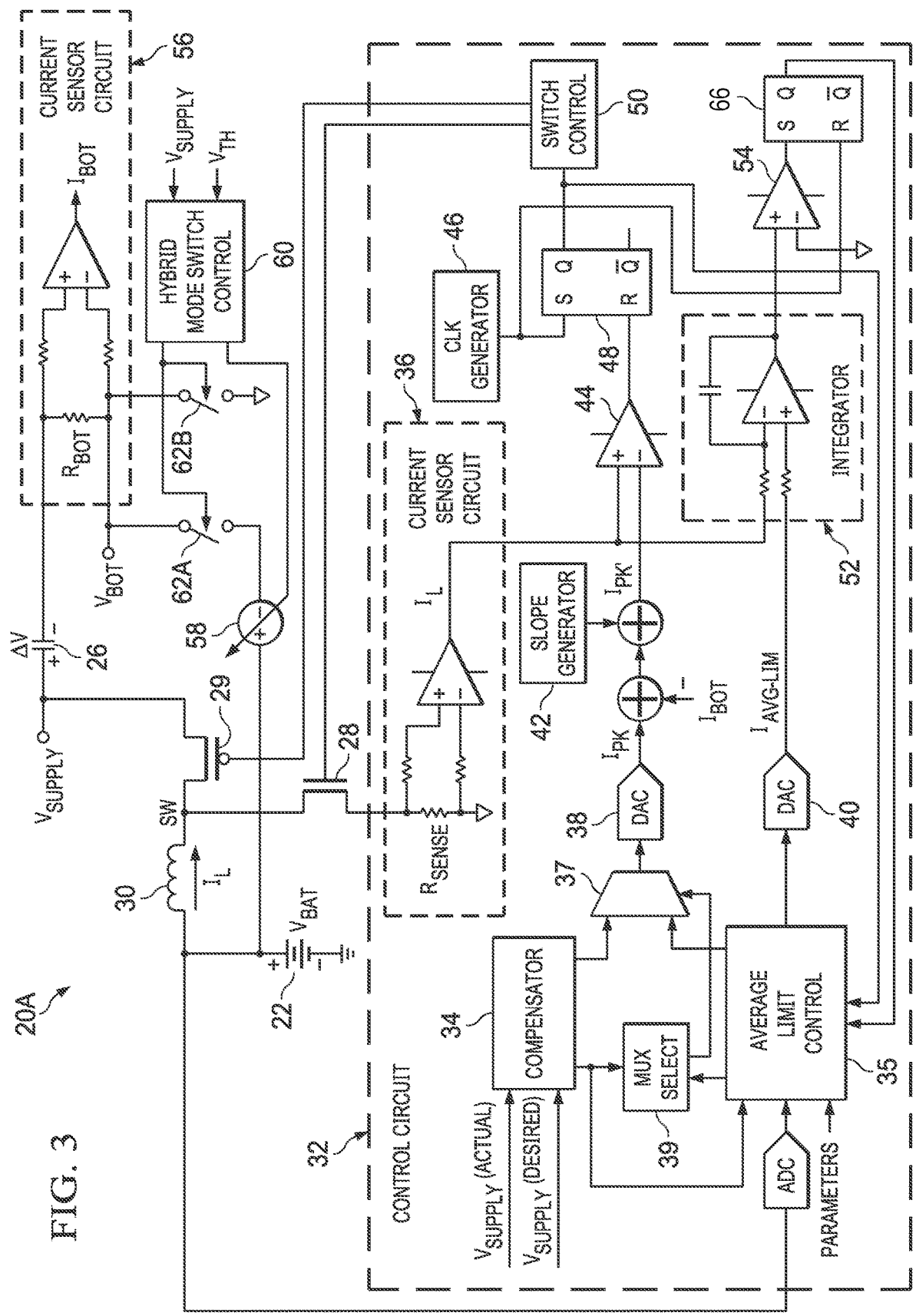
FIG. 3 illustrates a block diagram of selected components of an example hybrid peak-current control boost converter with average current limit control which may be used to implement the power supply shown in FIG. 2, in accordance with embodiments of the present disclosure.
Figure 4:
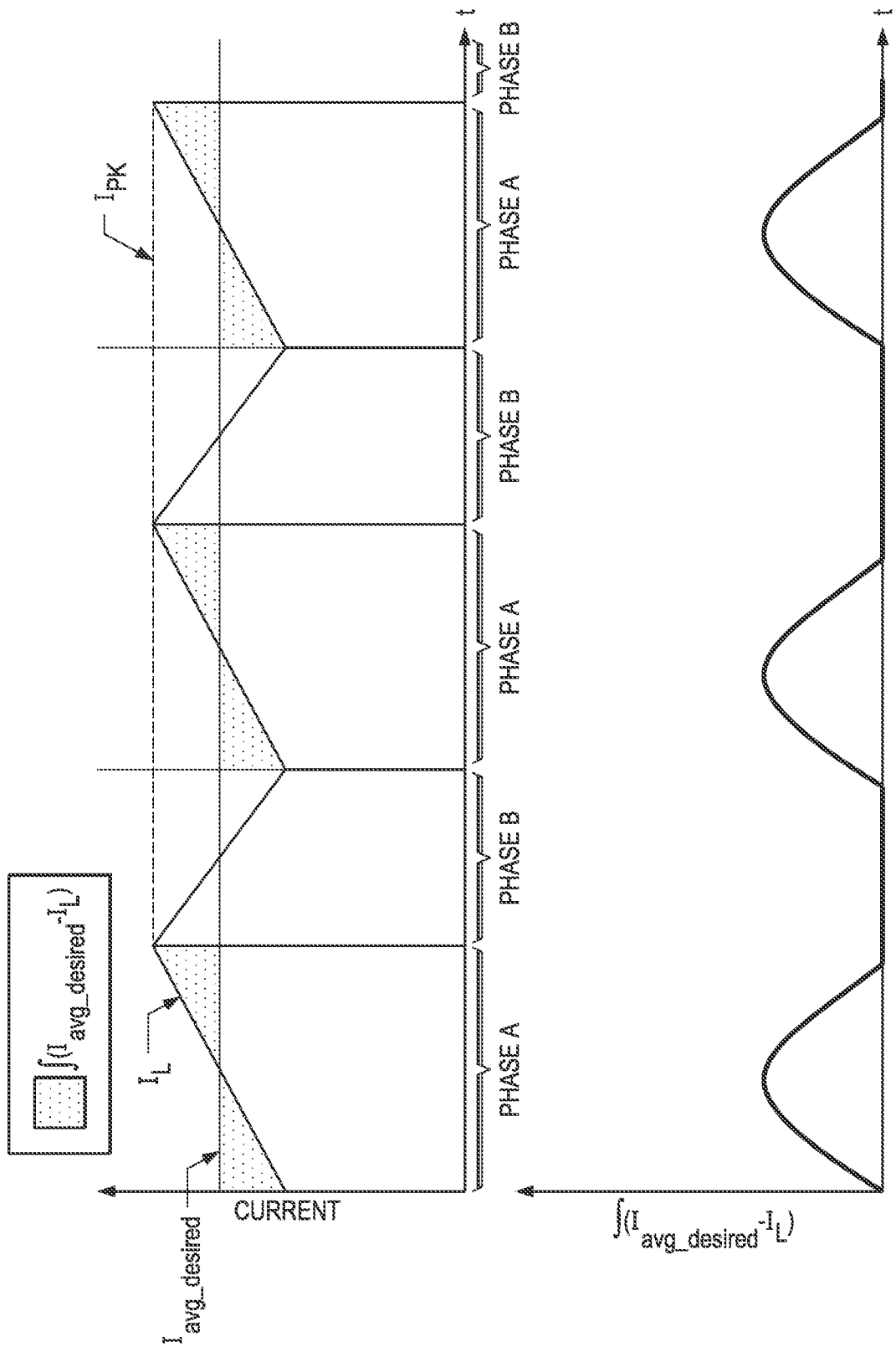
FIG. 4 illustrates graphs depicting example waveforms for actual inductor current and target average inductor current versus time and for a mathematical integral of a difference of the quantity of the target average inductor current and the actual inductor current target, in accordance with embodiments of the present disclosure.

FIG. 3 illustrates a block diagram of selected components of an example hybrid peak-current control boost converter 20A with average current limit control which may be used to implement power supply 10A shown in FIG. 2, in accordance with embodiments of the present disclosure. As shown in FIG. 3, boost converter 20A may include a battery 22, a power inductor 30, a switch 28 implemented as an n-type metal-oxide-semiconductor field-effect transistor (NFET), a switch 29 implemented as a p-type metal-oxide-semiconductor field-effect transistor (PFET), and a control circuit 32. FIG. 4 illustrates graphs depicting example waveforms for actual inductor current $I_L$ and target average inductor current $I_{AVG\_LIM}$ versus time and for a mathematical integral of a difference of the quantity of target average inductor current $I_{AVG\_LIM}$ and actual inductor current $I_L$, in accordance with embodiments of the present disclosure.

In a first phase (labeled as "Phase A" in FIG. 4) of a switching cycle of boost converter 20A, control circuit 32 may cause switch 28 to be activated (e.g., closed, turned on, enabled) and switch 29 to be deactivated (e.g., opened, turned off, disabled). Thus, during the first phase, a switch node (labeled as "SW" in FIG. 3) may be effectively shorted to a ground potential, such that battery 22 applies its voltage $V_{BAT}$ across terminals of power inductor 30. As a result, an inductor current $I_L$ flowing in power inductor 30 may increase during the first phase. As described in greater detail below, control circuit 32 may cause inductor current $I_L$ to increase until such point that inductor current $I_L$ reaches a slope-compensated peak current limit $I_{PK}'$, at which the first phase may end.

In a second phase (labeled as "Phase B" in FIG. 4) of the switching cycle of boost converter 20A, control circuit 32 may cause switch 28 to be deactivated and switch 29 to be activated. As a result, inductor current $I_L$ may decrease during the second phase as power inductor 30 discharges into boost capacitor 26, boosting the supply voltage $V_{SUPPLY}$ to a voltage higher than battery voltage $V_{BAT}$. In continuous conduction mode (CCM), the second phase (Phase B) may continue until the end of the switching cycle, after which the first phase (Phase A) again occurs, as shown in FIG. 4. In discontinuous conduction mode (DCM), the second phase (Phase B) may continue until inductor current $I_L$ reaches zero, at which point a third phase (not shown in FIG. 4) of the switching cycle may begin. In the third phase, if it exists, control circuit 32 may cause both of switches 28 and 29 to be deactivated, and inductor current $I_L$ may remain at zero until the beginning of the next switching cycle, in which the first phase (Phase A) again occurs. In some embodiments, control circuit 32 may deactivate switch 29 during the second phase (Phase B), such that a body diode of the PFET implementing switch 29 conducts inductor current $I_L$ until it reaches zero.

As its name suggests, hybrid peak-current control boost converter 20A may operate in one of at least two modes. In a first mode, switch 62B may be activated (e.g., on, closed, enabled) and switch 62A may be deactivated (e.g., off, open, disabled) such that a bottom plate of boost capacitor 26 corresponding to the negative terminal of supply voltage $V_{SUPPLY}$ is coupled to ground voltage. In a second mode, switch 62A may be activated and switch 62B may be deactivated such that a bottom plate of boost capacitor 26 (e.g., opposite of the top plate of boost capacitor 26 at which supply voltage $V_{SUPPLY}$ is present) is coupled to battery voltage $V_{BAT}$. Switching between the first mode and the second mode may be controlled by a hybrid mode switch controller 60. Hybrid mode switch controller 60 may be configured to transition from operation in the first mode to operation in the second mode when voltage $\Delta V$ across boost capacitor 26 drops below a predetermined threshold voltage $V_{TH}$. In addition, hybrid mode switch controller 60 may be configured to transition from operation in the second mode to operation in the first mode when voltage $\Delta V$ across boost capacitor 26 rises above a predetermined threshold voltage $V_{TH}$. The calculation of voltage $\Delta V$ may be either a direct measurement or may be calculated from supply voltage $V_{SUPPLY}$, the knowledge of switch states of switches 62A and 62B, the variable voltage provided by low-dropout regulator 58, and/or battery voltage $V_{BAT}$.

In some embodiments, control circuit 32 may be configured to selectively enable and disable coupling of the bottom plate of capacitor 26 to battery 22 at a first switching frequency significantly less than a second switching frequency at which switches 28 and 29 of hybrid peak-current control boost converter 20A are switched.

In these and other embodiments, control circuit 32 may be configured to selectively enable and disable coupling of the bottom plate of capacitor 26 to battery 22 at a switching frequency related to another frequency of a signal driven to a load an amplifier (e.g., amplifier 16) powered from hybrid peak-current control boost converter 20A. In these and other embodiments, control circuit 32 may be configured to selectively enable and disable coupling of the bottom plate of capacitor 26 to battery 22 at a switching frequency related to another frequency of a signal driven to a load by an amplifier (e.g., amplifier 16) powered from hybrid peak-current control boost converter 20A.

Although not shown in FIG. 3, in some embodiments, hybrid mode switch controller 60 may operate with hysteresis, such that a threshold voltage $V_{TH}$ for switching from the first mode to the second mode may be lower than a threshold voltage $V_{TH}$ for switching from the second mode to the first mode.

Figure 5:
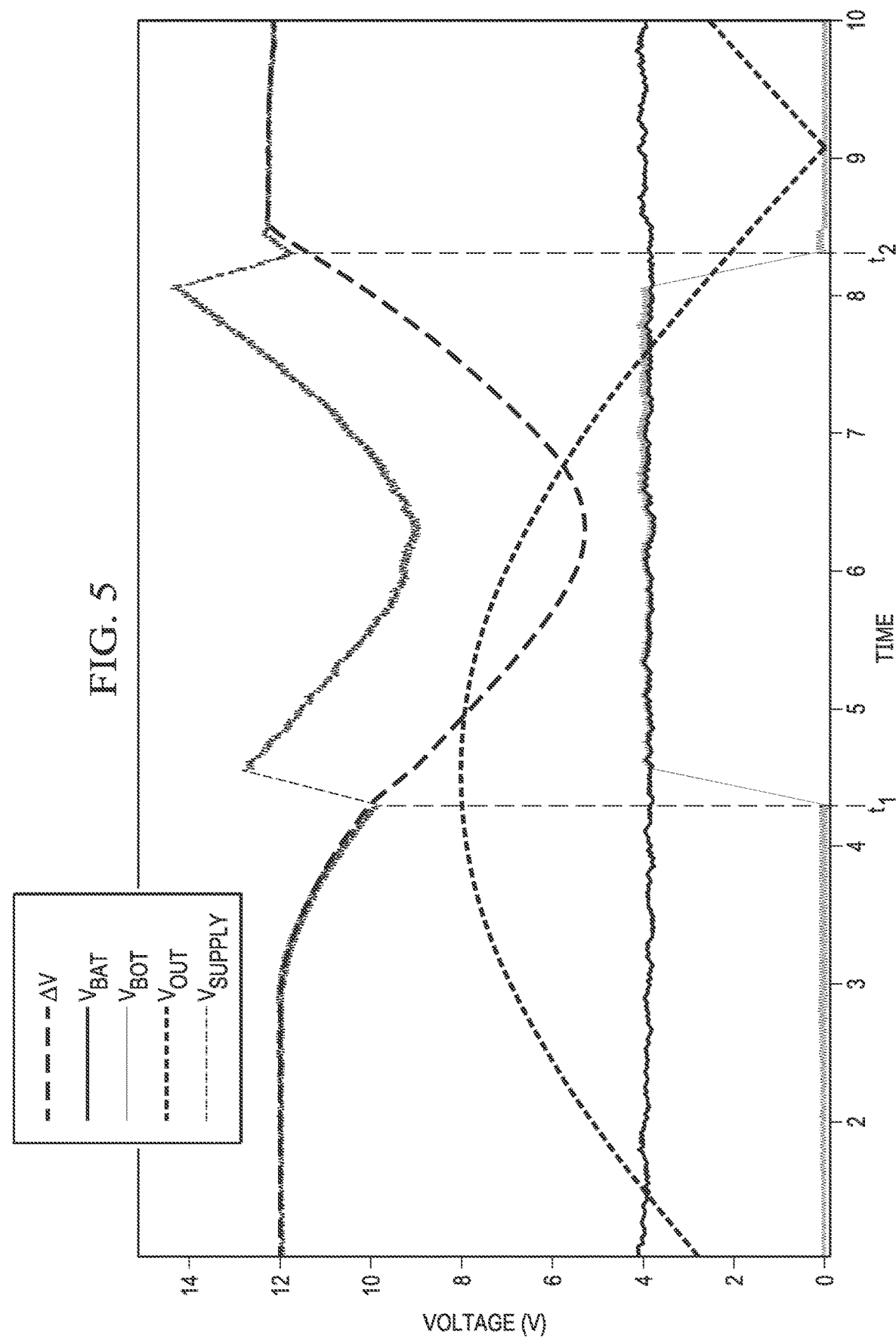
FIG. 5 illustrates graphs depicting example waveforms for selected voltages within the example hybrid peak-current control boost converter shown in FIG. 3, in accordance with embodiments of the present disclosure.

To further illustrate hybrid operation between the first mode and the second mode, FIG. 5 illustrates graphs depicting example waveforms for selected voltages of example hybrid peak-current control boost converter 20A when switched between the first mode and the second mode and between the second mode and the first mode, in accordance with embodiments of the present disclosure.

As shown in FIG. 5, as a magnitude of output signal $V_{OUT}$ generated by amplifier 16 increases, a droop in supply voltage $V_{SUPPLY}$ supplying amplifier 16 may occur. Such droop may occur because the current drawn by the hybrid peak-current control boost converter 20A from battery 22 may be limited by the circuitry shown in FIG. 3. This limited current may be required to protect battery 22 and/or to avoid brownout on other devices using battery 22 as a source of energy. Such droop in supply voltage $V_{SUPPLY}$ may be due to the load connected to the output of hybrid peak-current control boost converter 20A demanding more power than the limited operation of hybrid peak-current control boost converter 20A is able to provide. As such, when such droop occurs, the stored energy on capacitor 26 may be used to provide the necessary power to the load.

If such droop were to cause supply voltage $V_{SUPPLY}$ to drop below the magnitude of output signal $V_{OUT}$, clipping or other distortion may occur in output signal $V_{OUT}$. Accordingly, when supply voltage $V_{SUPPLY}$ drops below threshold voltage $V_{TH}$, at a time labeled $t_1$ in FIG. 5, hybrid mode switch controller 60 may cause transition between the first mode (in which the bottom plate of boost capacitor 26 is coupled to ground) to the second mode (in which the bottom plate of boost capacitor 26 is coupled to battery voltage $V_{BAT}$). As a result, a bottom plate voltage $V_{BOT}$ at the bottom plate of boost capacitor 26 may rise from zero to battery voltage $V_{BAT}$. Furthermore, because a voltage $\Delta V$ across boost capacitor 26 cannot instantaneously change, the increase in bottom plate voltage $V_{BOT}$ may cause a similar increase in supply voltage $V_{SUPPLY}$ (e.g., $V_{SUPPLY} = V_{BOT} + \Delta V$), ensuring supply voltage $V_{SUPPLY}$ remains above output signal $V_{OUT}$ by allowing hybrid peak-current control boost converter 20A to transfer more energy from boost capacitor 26 to amplifier 16 than would be possible if peak-current control boost converter 20A only operated in the first mode with the bottom plate of boost capacitor 26 coupled to ground. In fact, in particular implementations, hybrid operation between the two modes described herein may allow hybrid peak-current control boost converter 20A to utilize 1.8 times more energy (or would allow utilization of the same amount of energy with a boost capacitor 1.8 times smaller) than if peak-current control boost converter 20A only operated in the first mode with the bottom plate of boost capacitor 26 coupled to ground.

As shown in FIG. 3, hybrid peak-current control boost converter 20A may include a low-dropout regulator 58 coupled between battery 22 and switch 62A. In operation, hybrid mode switch controller 60 may, when switching hybrid operation from the first mode to the second mode and vice versa, control a voltage across low-dropout regulator 58 to allow for a controlled ramping of bottom plate voltage $V_{BOT}$ between zero and battery voltage $V_{BAT}$ and vice versa, in order to eliminate high-frequency switching artifacts that may occur in output signal $V_{OUT}$ due to sudden changes in supply voltage $V_{SUPPLY}$.

Also as depicted in FIG. 3, hybrid peak-current control boost converter 20A may include a current sensor circuit 56 to sense current $I_{BOT}$ flowing through boost capacitor 26. Current sensor circuit 56 may measure current $I_{BOT}$ using a sense resistor with resistance $R_{BOT}$. In some embodiments, $R_{BOT}$ may have a resistance of approximately 10 mΩ. As described in greater detail below, measured current $I_{BOT}$ may be used by control circuit 32.

Turning back to FIG. 3, control circuit 32 may include a compensator 34, current average limit control block 35, a multiplexer 37, a current sensor circuit 36, a digital-to-analog converter (DAC) 38, a DAC 40, a slope generator 42, a peak current comparator 44, a clock (CLK) generator 46, a latch 48, switch block control 50, integrator 52, integrator comparator 54, and latch 66.

In operation in both CCM and DCM, the duty cycle of switch 28 (e.g., the duration of the first phase (Phase A)) may determine the magnitude of supply voltage $V_{SUPPLY}$ relative to battery voltage $V_{BAT}$. For example, in CCM, the duty cycle D needed to provide a desired supply voltage $V_{SUPPLY}$ may be given by $D = 1 - V_{BAT}/V_{SUPPLY}$. Thus, for a desired level of supply voltage $V_{SUPPLY}$ (e.g., which may be based on an envelope of an output signal of an amplifier), control circuit 32 may implement a feedback control loop, which may be internal to compensator 34, based on measured supply voltage $V_{SUPPLY}$ and measured inductor current $I_L$, which may be measured by current sensor circuit 36 (e.g., using a sense resistor with resistance $R_{SENSE}$; in some embodiments, $R_{SENSE}$ may have a resistance of approximately 10 mΩ). Thus, control circuit 32 may monitor actual supply voltage $V_{SUPPLY}$, compare it against a desired supply voltage $V_{SUPPLY}$, and increase or decrease actual supply voltage $V_{SUPPLY}$ by increasing or decreasing the peak of inductor current $I_L$. In that vein, compensator 34 may generate a digital signal indicative of a desired peak current, and DAC 38 may, when multiplexer 37 is selected to output the output of compensator 34, convert such digital signal into an analog equivalent peak current signal $I_{PK}$. Further, as shown in FIG. 3, measured current $I_{BOT}$ through boost capacitor 26 may be subtracted from peak current signal $I_{PK}$ to compensate for current from battery 22 that charges boost capacitor 26, as opposed to inductor current $I_L$ charging boost capacitor 26.

Slope generator 42 may generate a slope compensation signal. In some embodiments, slope generator 42 may generate the slope compensation signal as a triangle or sawtooth waveform. The slope compensation signal may be combined with peak current signal $I_{PK}$ to generate slope-compensated peak current signal $I_{PK}'$. Peak current comparator 44 may, during the first phase (Phase A), compare a measured inductor current $I_L$ (e.g., measured by a current sensor circuit 36), generating a control signal responsive to the comparison. Together, the output of comparator 44, clock generator 46, and latch 48 may be arranged as shown, or arranged in another suitable manner, to generate a control signal to switch control block 50. For example, clock generator 46 may generate a clock signal indicating the beginning of a switching cycle (e.g., beginning of the first phase/Phase A) and comparator 44 may, based on a point in which measured inductor current $I_L$ reaches peak current $I_{PK}$, generate a signal indicating the end of the first phase (Phase A). Based on such signals indicating timing of switch cycles and switch phases of boost converter 20A, latch 48 may generate appropriate control signal(s) to switch control block 50, which may in turn generate appropriate control signals to switches 28 and 29 to accordingly selectively activate and deactivate switches 28 and 29.

In addition, current average limit control block 35 may generate a digital signal indicative of a target average current limit, which DAC 40 may convert into an equivalent analog target average current signal $I_{AVG\_LIM}$ representative of a maximum average current to flow through power inductor 30. Such target average current signal $I_{AVG\_LIM}$ may be set based on a maximum current limit of power inductor 30, which may be among the parameters received by average limit control block 35. Other parameters received by average limit control block 35 may include battery voltage $V_{BAT}$ and/or a parameter programmed to be indicative of maximum current as a function of battery voltage $V_{BAT}$. Additional or alternative parameters may include supply voltage $V_{SUPPLY}$, digital audio input signal DIG_IN, and/or analog signal $V_{IN}$.

Average limit control block 35 may also generate its own version of peak current $I_{PK}$ (which may be different than that generated by compensator 34) based on target average current signal $I_{AVG\_LIM}$ such that inductor current $I_L$ does not exceed the maximum current limit based on a control loop including integrator 52, integrator comparator 54, and latch 66. As shown in FIG. 3, a multiplexer 37 may select one of the peak current signals generated by compensator 34 and average limit control block 35 based on a control signal communicated from multiplexer select block 39.

Multiplexer select block 39 may be configured such that, if the peak current determined by compensator 34 is less than the peak current determined by average limit control block 35, multiplexer select block 39 may cause multiplexer 37 to select the peak current determined by compensator 34. On the other hand, if the peak current determined by compensator 34 is greater than the peak current determined by average limit control block 35, then multiplexer select block 39 may cause multiplexer 37 to select the peak current determined by average limit control block 35.

In some embodiments, the maximum current limit of power inductor 30 may be determined by analyzing timing information of the output of latch 48 and the output of latch 66. Because the output of compensator 34 may have a slope compensation value added to it, the actual value of the peak current of inductor current $I_L$ may be different than that represented by the output of compensator 34. As such, when the current limiting behavior is applied (e.g., by multiplexer select block 39 causing multiplexer 37 to select the peak current determined by average limit control block 35), the value of compensator 34 at that point in time may be registered by average limit control block 35 and used as a reference to determine if compensator 34 has decreased its value below that of the controlled limited current as represented by target average current signal $I_{AVG\_LIM}$.

Accordingly, average limit control block 35 may operate to maintain the inductor current $I_L$ as measured over multiple switching cycles of boost converter 20A to operate at the average current limit as set by average limit control block 35 on the input to DAC 40. Accordingly, boost converter 20A may increase the value for peak current delivered to the input of DAC 38 until the average of inductor current $I_L$ is larger than the value for peak current delivered to the input of DAC 40. Once this occurs, average limit control block 35 may operate to decrease the value for peak current delivered to the input of DAC 38 until the average of inductor current $I_L$ is smaller than that of the value for peak current delivered to the input of DAC 40. Such operation may over time maintain the average inductor current at the current $I_{AVG\_LIM}$ value as represented by the output of DAC 40.

To further illustrate, consider the waveforms for measured current $I_L$ and target average current signal $I_{AVG\_LIM}$ shown in FIG. 4. Because boost converter 20A must operate with volt-second balancing, the average current during the second phase in CCM (Phase B) must be equal to average current during the first phase (Phase A) when in steady state. A simple analysis may show that during the first phase (Phase A), if the average current of power inductor 30 is equal to a desired average current $I_{avg\_desired}$, the mathematical integral of the actual inductor current $I_L$ during the first phase (Phase A) will be equal to the mathematical integral of the desired average current during the first phase. Therefore, if the first phase has a duration of time T1, it is known that:

$$\frac{\int_0^{T1} I_L}{T1} = \frac{\int_0^{T1} I_{avg\_desired}}{T1}$$

Thus:

$$\int_0^{T1} I_L = \int_0^{T1} I_{avg\_desired}$$

and $$\int_0^{T1} I_L - \int_0^{T1} I_{avg\_desired} = 0$$

Therefore:

$$\int_0^{T1} (I_L - I_{avg\_desired}) = 0$$

As the equations above show, if a difference between measured inductor current $I_L$ and desired average current $I_{avg\_desired}$ is integrated over the first phase (Phase A), the result of the integration will be zero (0). The equations above show that if the value over the T1 period is integrated, then the value will be zero. Likewise, if the difference is integrated, the T1 value can be found when the result of the integral is zero (0). FIG. 4 also shows the value of the integration of a difference between measured inductor current $I_L$ and the desired average current $I_{avg\_desired}$. The order of the subtraction is not critical as the critical detection point is when the integral is equal to zero.

To take advantage of the above analysis, integrator 52 may calculate a mathematical integral of the difference between actual inductor current $I_L$ and target average current signal $I_{AVG\_LIM}$, and integrator comparator 54 may compare the result to zero, such that latch 66 may generate an output indicative of when the integration performed by integrator 52 is zero. As a result of such output, digital compensation and current average limit control block 35 may appropriately modify target average current signal $I_{AVG\_LIM}$ and peak current $I_{PK}$ for subsequent switching cycles of boost converter 20A.

Accordingly, to alleviate the concerns with respect to inductor variation and to completely remove the errors associated in determining the average current while controlling the peak current, an integrator circuit may be provided prior to a current averaging comparator to allow for a determination of when the average input current of the boost converter crosses a threshold circuit. Blanking circuitry (not shown) may be provided to allow the current averaging comparator to not indicate that the threshold is crossed at the initiation of the first phase (Phase A), as the integrator may be set to zero at the beginning of the first phase.

Figure 6:
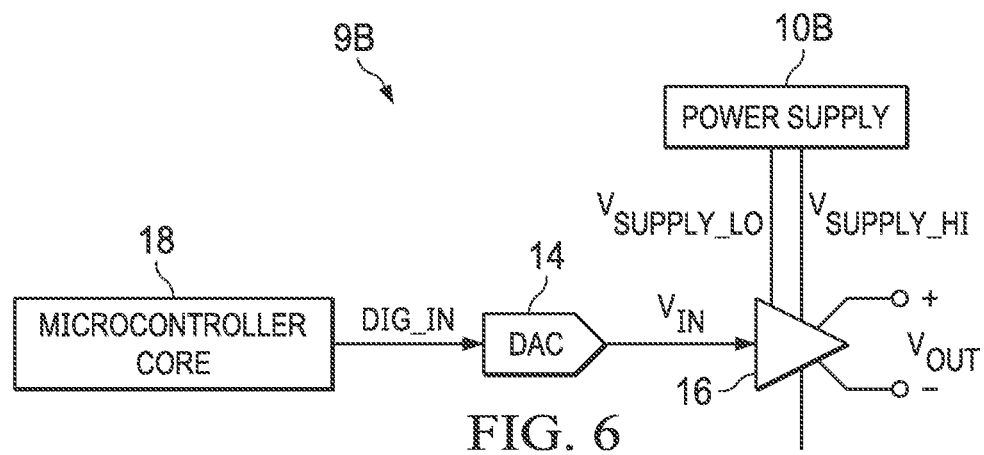
FIG. 6 illustrates a block diagram of selected components of another example integrated circuit of a personal audio device, in accordance with embodiments of the present disclosure.

FIG. 6 illustrates a block diagram of selected components of an example IC 9B of a personal audio device, in accordance with embodiments of the present disclosure. In some embodiments, example IC 9B shown in FIG. 6 may be used to implement IC 9 of FIG. 1. As shown in FIG. 6, a microcontroller core 18 may supply a digital input signal DIG_IN to a digital-to-analog converter (DAC) 14, which may convert the digital input signal to an analog signal $V_{IN}$. DAC 14 may supply analog signal $V_{IN}$ to an amplifier 16 which may amplify or attenuate input signal $V_{IN}$ to provide a differential output signal $V_{OUT}$, which may operate a speaker, a headphone transducer, a line level signal output, and/or other suitable output. In some embodiments, DAC 14 may be an integral component of amplifier 16. A power supply 10B may provide a plurality of power supplies (e.g., supply voltage $V_{SUPPLY\_HI}$ and $V_{SUPPLY\_LO}$) to amplifier 16. In some embodiments, power supply 10B may comprise a switched-mode power converter, as described in greater detail below. Although FIG. 6 contemplates that IC 9B resides in a personal audio device, systems and methods described herein may also be applied to electrical and electronic systems and devices other than a personal audio device, including systems for use in a computing device larger than a personal audio device, such as an automobile, a building, or other structure. Further, systems and methods described herein may also be applied to electrical and electronic systems and devices other than audio devices and audio transducers, such as vibro-haptic transducers, piezoelectric transducers, or other transducers.

As described above and shown in FIG. 6, power supply 10B may provide a higher supply voltage $V_{SUPPLY\_HI}$ and a lower supply voltage $V_{SUPPLY\_LO}$. Accordingly, amplifier 16 may be configured as a Class-G amplifier that may select between higher supply voltage $V_{SUPPLY\_HI}$ and lower supply voltage $V_{SUPPLY\_LO}$ depending upon a magnitude of output signal $V_{OUT}$. In these and other embodiments, a system may include a plurality of devices (e.g., amplifiers 16 or other devices) each of which may operate at a specific supply voltage, in which case some of such devices may use higher supply voltage $V_{SUPPLY\_HI}$ supplied from power supply 10B and other device may use lower supply voltage $V_{SUPPLY\_LO}$ supplied from power supply 10B.

Figure 7A:
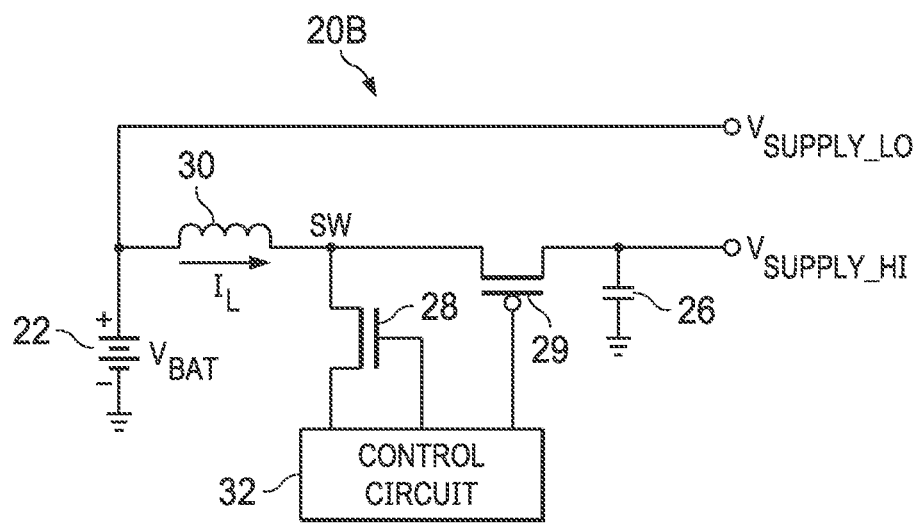
FIG. 7A illustrates a block diagram of selected components of an example power converter which may be used to implement the power supply shown in FIG. 6, in accordance with embodiments of the present disclosure.

FIG. 7A illustrates a block diagram of selected components of an example power converter 20B which may be used to implement power supply 10B shown in FIG. 6, in accordance with embodiments of the present disclosure. In many respects, power converter 20B may be similar in structure and function to boost converter 20A depicted in FIG. 3 (including, e.g., similar components of control circuit 32, details of which are omitted from FIG. 7A). As shown in FIG. 7A, power converter 20B may include a boost converter comprising a power inductor 30 and switches 28 and 29 under the control of control circuit 32 in order to generate a supply voltage $V_{SUPPLY\_HI}$ across a boost capacitor 26, wherein supply voltage $V_{SUPPLY\_HI}$ is higher than a battery voltage $V_{BAT}$ of battery 22. In some embodiments, battery 22 may comprise a multi-cell battery.

In order to operate with greater power efficiency (e.g., as compared to power converter 20B supplying only supply voltage $V_{SUPPLY\_HI}$), power converter 20B may also supply a supply voltage $V_{SUPPLY\_LO}$ lower than supply voltage $V_{SUPPLY\_HI}$. Thus, to reduce power consumption, including idle power consumption of an amplifier 16 or other circuit supplied from power converter 20B, such amplifier 16 or other circuit (or control circuitry for such amplifier or other circuitry) may select between supply voltage $V_{SUPPLY\_LO}$ and supply voltage $V_{SUPPLY\_HI}$ based on actual power supply needs of such amplifier 16 or other circuit (e.g., a magnitude of an output signal $V_{OUT}$ driven by amplifier 16). Thus, as shown in FIG. 7A, power converter 20B may provide battery voltage $V_{BAT}$ of battery 22 as lower supply voltage $V_{SUPPLY\_LO}$.

However, for higher values of battery voltage $V_{BAT}$, as may be the case when battery 22 comprises a multi-cell battery, the use of battery voltage $V_{BAT}$ as lower supply voltage $V_{SUPPLY\_LO}$ may provide minimal power savings, particularly for low levels of output signal $V_{OUT}$ driven by amplifier 16.

Figure 7B:
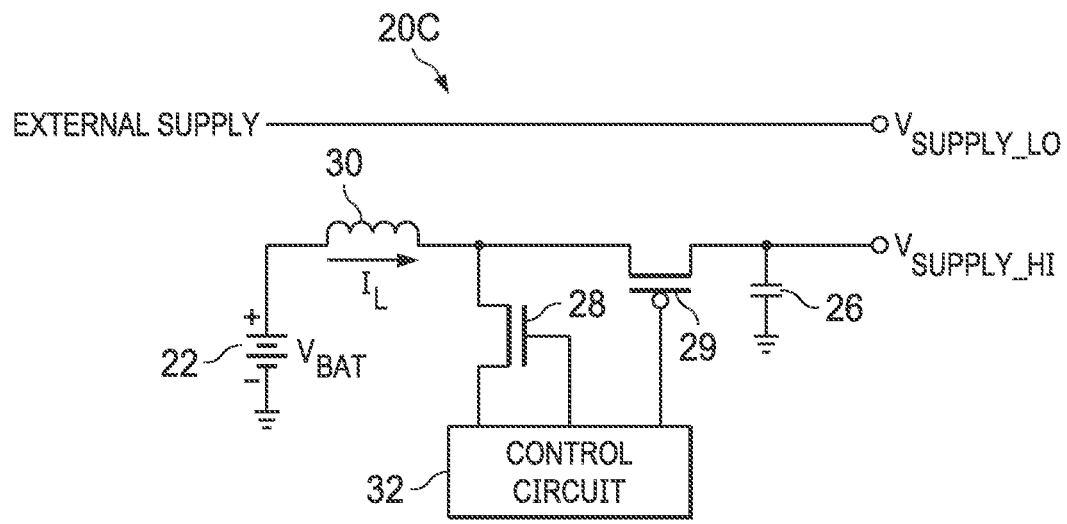
FIG. 7B illustrates a block diagram of selected components of another example power converter which may be used to implement the power supply shown in FIG. 6, in accordance with embodiments of the present disclosure.

To overcome such limitation, FIG. 7B illustrates a block diagram of selected components of another example power converter 20C which may be used to implement power supply 10B shown in FIG. 6, in accordance with embodiments of the present disclosure. A main difference between power converter 20C of FIG. 7B as compared to power converter 20B of FIG. 7A is that instead of battery voltage $V_{BAT}$ of battery 22 being supplied as lower supply voltage $V_{SUPPLY\_LO}$, power converter 20C may provide a voltage supply lower than battery voltage $V_{BAT}$ external to power converter 20C as lower supply voltage $V_{SUPPLY\_LO}$. However, the use of a voltage supply lower than battery voltage $V_{BAT}$ may provide minimal power savings for medium levels of output signal $V_{OUT}$ driven by amplifier 16.

Figure 7C:
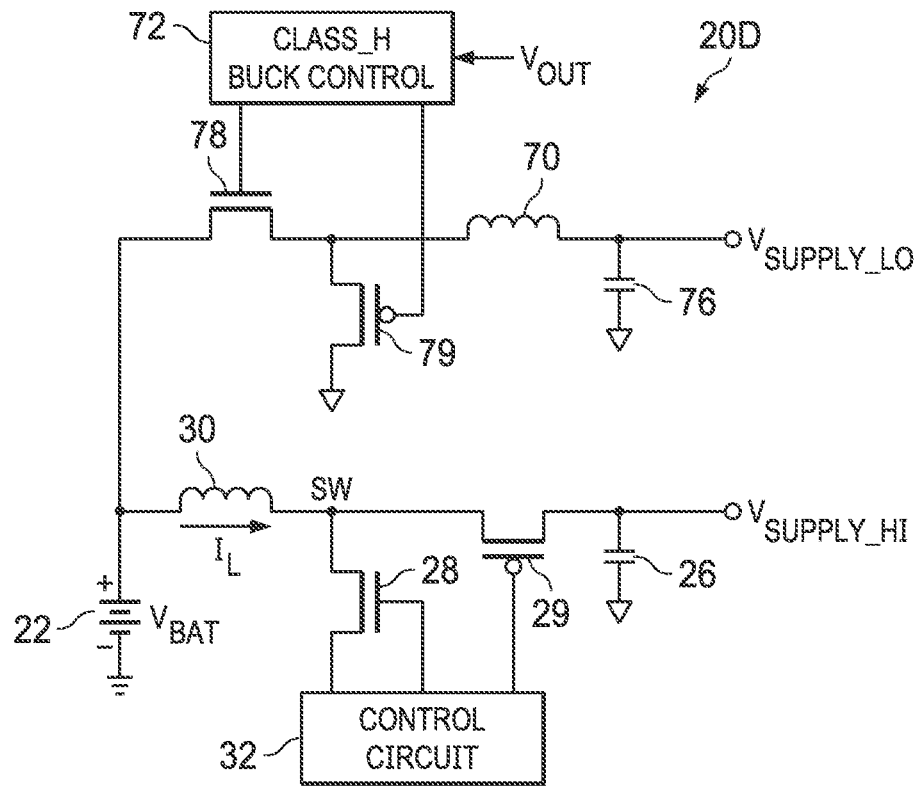
FIG. 7C illustrates a block diagram of selected components of yet another example power converter which may be used to implement the power supply shown in FIG. 6, in accordance with embodiments of the present disclosure.

To overcome both the limitations of power converter 20B and power converter 20C, FIG. 7C illustrates a block diagram of selected components of yet another example power converter 20D which may be used to implement power supply 10B shown in FIG. 6, in accordance with embodiments of the present disclosure. As shown in FIG. 7C, power converter 20D may implement a boost converter comprising a power inductor 30 and switches 28 and 29 under the control of control circuit 32 in order to generate a supply voltage $V_{SUPPLY\_HI}$ across a boost capacitor 26, wherein supply voltage $V_{SUPPLY\_HI}$ is higher than a battery voltage $V_{BAT}$ of battery 22. In addition, power converter 20D may implement a Class-H envelope tracking buck converter comprising a power inductor 70, buck capacitor 76, and switches 78 and 79 under the control of a Class-H buck control circuit 72 in order to generate a supply voltage $V_{SUPPLY\_LO}$ across a boost capacitor 26, wherein supply voltage $V_{SUPPLY\_LO}$ is lower than a battery voltage $V_{BAT}$ of battery 22 and tracks a signal envelope of output signal $V_{OUT}$. Advantageously, the topology of power converter 20D may be capable of using the same amount of stored energy of boost capacitor 26 as power converter 20B, but the presence of the Class-H tracking buck converter in power converter 20D and the ability to provide higher supply voltage $V_{SUPPLY\_HI}$ and lower supply voltage $V_{SUPPLY\_LO}$ may result in significantly lower idle power consumption and greater power efficiency of power converter 20D compared to that of power converter 20B.

Figure 8:
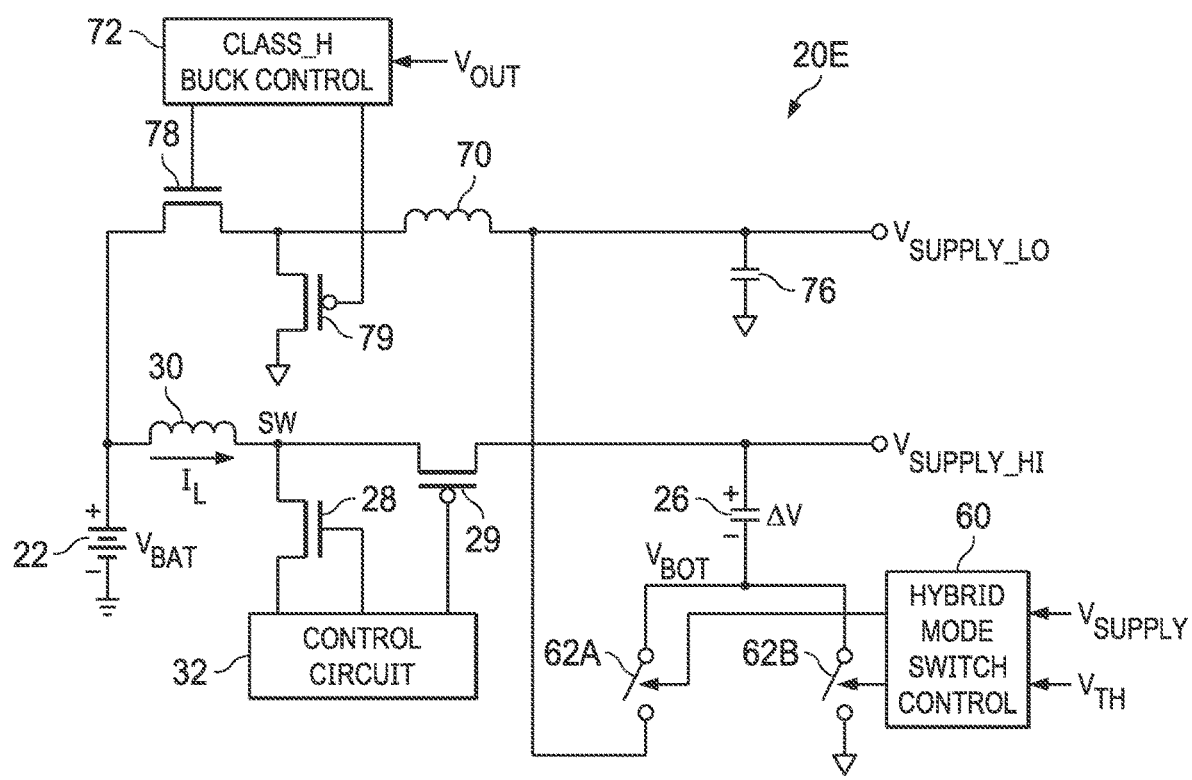
FIG. 8 illustrates a block diagram of selected components of another example hybrid power converter which may be used to implement the power supply shown in FIG. 6, in accordance with embodiments of the present disclosure.

To leverage the advantages of both power converters 20A and 20D, FIG. 8 illustrates a block diagram of selected components of an example hybrid power converter 20E which may be used to implement power supply 10B shown in FIG. 6, in accordance with embodiments of the present disclosure. As shown in FIG. 8, hybrid power converter 20E may implement a boost converter comprising a power inductor 30 and switches 28 and 29 under the control of control circuit 32 in order to generate a supply voltage $V_{SUPPLY\_HI}$ across a boost capacitor 26, wherein supply voltage $V_{SUPPLY\_HI}$ is higher than a battery voltage $V_{BAT}$ of battery 22. In addition, hybrid power converter 20E may implement a Class-H envelope tracking buck converter comprising a power inductor 70, buck capacitor 76, and switches 78 and 79 under the control of a Class-H buck control circuit 72 in order to generate a supply voltage $V_{SUPPLY\_LO}$ across boost capacitor 26, wherein supply voltage $V_{SUPPLY\_LO}$ is lower than a battery voltage $V_{BAT}$ of battery 22 and tracks a signal envelope of output signal $V_{OUT}$. In addition, hybrid power converter 20E may operate in one of at least two modes. In a first mode, switch 62B may be activated (e.g., on, closed, enabled) and switch 62A may be deactivated (e.g., off, open, disabled) such that a bottom plate of boost capacitor 26 corresponding to the negative terminal of supply voltage $V_{SUPPLY}$ is coupled to ground voltage. In a second mode, switch 62A may be activated and switch 62B may be deactivated such that a bottom plate of boost capacitor 26 (e.g., opposite of the top plate of boost capacitor 26 at which supply voltage $V_{SUPPLY}$ is present) is coupled to supply voltage $V_{SUPPLY\_LO}$. Switching between the first mode and the second mode may be controlled by a hybrid mode switch controller 60. Hybrid mode switch controller 60 may be configured to transition from operation in the first mode to operation in the second mode when supply voltage $V_{SUPPLY\_HI}$ drops below a predetermined threshold voltage $V_{TH}$. In addition, hybrid mode switch controller 60 may be configured to transition from operation in the second mode to operation in the first mode when supply voltage $V_{SUPPLY\_HI}$ rises above a predetermined threshold voltage $V_{TH}$. Although not shown in FIG. 8, in some embodiments, hybrid mode switch controller 60 may operate with hysteresis, such that a threshold voltage $V_{TH}$ for switching from the first mode to the second mode may be lower than a threshold voltage $V_{TH}$ for switching from the second mode to the first mode.

Figure 9:
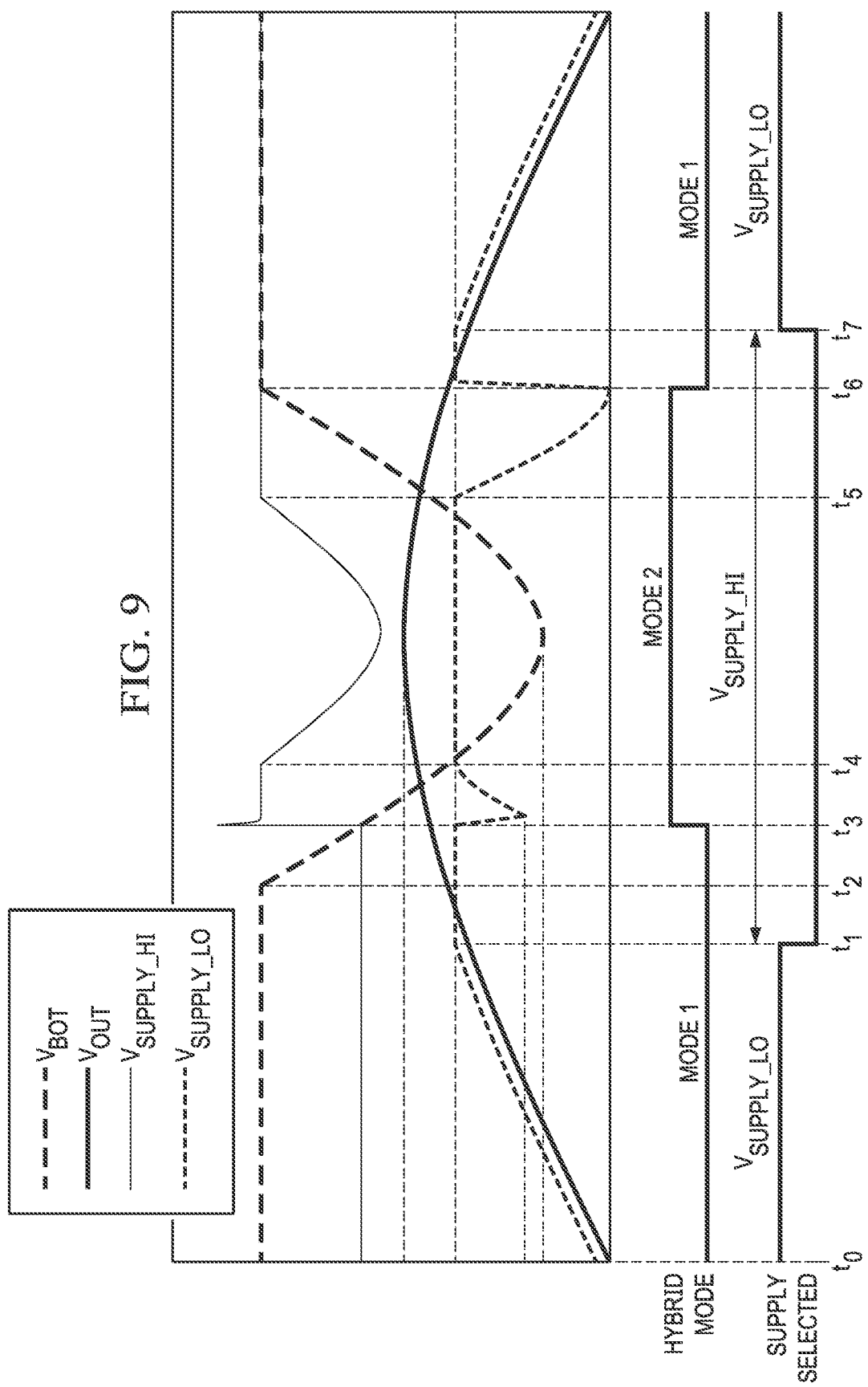
FIG. 9 illustrates graphs depicting example waveforms for selected voltages within the example hybrid power converter shown in FIG. 8, in accordance with embodiments of the present disclosure.

To further illustrate hybrid operation between the first mode and the second mode, FIG. 9 illustrates graphs depicting example waveforms for selected voltages of example hybrid power converter 20E when switched between the first mode and the second mode and between the second mode and the first mode, in accordance with embodiments of the present disclosure. As shown in FIG. 9, at a time t0, hybrid mode switch control 60 may set the operating mode of hybrid power converter 20E to the first mode, and a Class-G control of an amplifier 16 may select supply voltage $V_{SUPPLY\_LO}$ as its supply voltage. As output signal $V_{OUT}$ increases, Class-H buck control circuit 72 may cause supply voltage $V_{SUPPLY\_LO}$ to track output signal $V_{OUT}$. At a time $t_1$, output signal $V_{OUT}$ may increase to a level at which Class-H buck control circuit 72 can no longer track output signal $V_{OUT}$, and thus, at such time $t_1$ a Class-G control of an amplifier 16 may select supply voltage $V_{SUPPLY\_HI}$ as its supply voltage and supply voltage $V_{SUPPLY\_HI}$ may begin supplying current to such amplifier 16.

At a time $t_2$, due to further increase in output signal $V_{OUT}$, a boost current limit for the boost converter of hybrid power converter 20E may be reached, and a voltage $\Delta V$ across boost capacitor 26 may begin to decrease. At time $t_3$, at which voltage $\Delta V$ across capacitor 26 drops below a threshold voltage $V_{TH}$, Class-H buck control circuit 72 may set a target for supply voltage $V_{SUPPLY\_LO}$ to the difference between supply voltage $V_{SUPPLY\_HI}$ and threshold voltage $V_{TH}$, and hybrid mode switch control 60 may set the operating mode of hybrid power converter 20E to the second mode, thus coupling the bottom plate of boost capacitor 26 to supply voltage $V_{SUPPLY\_LO}$.

Accordingly, once supply voltage $V_{SUPPLY\_LO}$ across buck capacitor 76 discharges to the maximum of supply voltage $V_{SUPPLY\_HI}$ (e.g., 20V) minus threshold voltage $V_{TH}$ at time $t_4$, Class-H buck controller 72 and the buck converter of hybrid power converter 20E may regulate the voltage $V_{BOT}$ at the bottom plate of boost capacitor 26. As the amplifier 16 loading hybrid power converter 20E continues to draw current, Class-H buck controller 72 and the buck converter of hybrid power converter 20E may attempt to regulate supply voltage $V_{SUPPLY\_HI}$ to its maximum voltage (e.g., 20V) by increasing voltage $V_{BOT}$, allowing boost capacitor 26 to discharge and use its stored energy to supply current to the amplifier 16 loading hybrid power converter 20E.

As output signal $V_{OUT}$ decreases, supply voltage $V_{SUPPLY\_HI}$ may increase back to its maximum voltage (e.g., 20V) at time $t_5$, and may be held at such maximum voltage by Class-H buck controller 72 and the buck converter of hybrid power converter 20E decreasing voltage $V_{BOT}$. At time $t_6$, when voltage $V_{BOT}$ has decreased to zero, hybrid mode switch control 60 may set the operating mode of hybrid power converter 20E to the first mode, thus coupling the bottom plate of boost capacitor 26 to ground. At such point, Class-H buck controller 72 and the buck converter of hybrid power converter 20E may increase supply voltage $V_{SUPPLY\_LO}$ to its maximum voltage (e.g., 9 V), so that it is ready to be selected as the supply voltage for amplifier 16 when output signal $V_{OUT}$ decreases below such maximum voltage of supply voltage $V_{SUPPLY\_LO}$.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
    a power converter configured to generate a first supply voltage at a first supply output of the power supply, the power converter having a maximum allowable input power drawn from a power source;
    an energy storage element coupled to an output of the power converter at a top plate of the energy storage element, wherein the energy storage element is configured to store excess energy; and
    a second supply output configured to generate a second supply voltage lower than the first supply voltage, wherein:
        the second supply voltage tracks an envelope of an output signal generated by an amplifier coupled to the power supply when the amplifier consumes power from the second supply output; and
        the second supply voltage regulates a voltage at a bottom plate of the energy storage element when the amplifier consumes power from the first supply output.

2. A method in a system having a power converter configured to generate a first supply voltage at a first supply output of a power supply, the power converter having a maximum allowable input power drawn from a power source, an energy storage element coupled to an output of the power converter at a top plate of the energy storage element, wherein the energy storage element is configured to store excess energy, and a second supply output configured to generate a second supply voltage lower than the first supply voltage, the method comprising:
    tracking, with the second supply voltage, an envelope of an output signal generated by an amplifier coupled to the power supply when the amplifier consumes power from the second supply output; and
    regulating, with the second supply voltage, a voltage at a bottom plate of the energy storage element when the amplifier consumes power from the first supply output.

* * * * *

UNITED STATES PATENT AND TRADEMARK OFFICE
CERTIFICATE OF CORRECTION

PATENT NO. : 11,909,317 B2
APPLICATION NO. : 18/174106
DATED : February 20, 2024
INVENTOR(S) : King et al.

Page 1 of 1

It is certified that error appears in the above-identified patent and that said Letters Patent is hereby corrected as shown below:

In the Claims

In Column 16, Line 10, in Claim 1, delete "the power supply," and insert -- a power supply, --, therefor.

Signed and Sealed this
Twenty-second Day of July, 2025

Coke Morgan Stewart
*Acting Director of the United States Patent and Trademark Office*